(12) United States Patent
Wu et al.

(10) Patent No.: US 12,431,466 B2
(45) Date of Patent: Sep. 30, 2025

(54) LIGHT-EMITTING DIODE DISPLAY

(71) Applicant: Prilit Optronics, Inc., Tainan (TW)

(72) Inventors: Biing-Seng Wu, Tainan (TW);
Hsing-Ying Lee, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 590 days.

(21) Appl. No.: 17/900,056

(22) Filed: Aug. 31, 2022

(65) Prior Publication Data

US 2023/0260967 A1   Aug. 17, 2023

Related U.S. Application Data

(60) Provisional application No. 63/311,261, filed on Feb. 17, 2022.

(51) Int. Cl.
*H01L 25/065* (2023.01)
*H10H 20/852* (2025.01)
*H10H 20/855* (2025.01)
*H10H 20/856* (2025.01)

(52) U.S. Cl.
CPC ....... *H01L 25/0657* (2013.01); *H10H 20/852* (2025.01); *H10H 20/855* (2025.01); *H10H 20/856* (2025.01)

(58) Field of Classification Search
CPC ............. H01L 25/0657; H10H 20/852; H10H 20/855; H10H 20/856
See application file for complete search history.

(56) References Cited

U.S. PATENT DOCUMENTS

| 11,081,531 | B2 | 8/2021 | Cho | |
|---|---|---|---|---|
| 11,538,853 | B2 * | 12/2022 | Liao | H01L 25/0753 |
| 2019/0064985 | A1 * | 2/2019 | Zhu | G06F 3/0412 |
| 2021/0191552 | A1 * | 6/2021 | Bok | H10K 59/38 |
| 2021/0399042 | A1 * | 12/2021 | Li | H10F 55/18 |

FOREIGN PATENT DOCUMENTS

| CN | 205692492 U | 11/2016 |
|---|---|---|
| KR | 20080059856 A | 7/2008 |
| KR | 20160001311 A | 1/2016 |
| TW | 201929218 A | 7/2019 |

OTHER PUBLICATIONS

Office Action Dated Feb. 1, 2024 in corresponding Taiwan Patent Application No. 111136354.
Office Action Dated Mar. 28, 2024 in corresponding Indian Patent Application No. 202314010767.

* cited by examiner

*Primary Examiner* — Mary Ellen Bowman
(74) *Attorney, Agent, or Firm* — Donald E. Stout; Stout, Uxa & Buyan, LLP

(57) ABSTRACT

A light-emitting diode (LED) display includes a top-emission LED that emits light upward; a bottom-emission LED that emits light downward; and a spacer disposed between the top-emission LED and the bottom-emission LED, thereby providing a dual-sided display.

20 Claims, 7 Drawing Sheets

LIGHT-EMITTING DIODE DISPLAY

CROSS-REFERENCE TO RELATED APPLICATIONS

This application claims the benefit under 35 U.S.C. 119 of the filing date of U.S. Provisional Application No. 63/311,261, filed on Feb. 17, 2022, the entire contents of which are herein expressly incorporated by reference.

BACKGROUND OF THE INVENTION

1. Field of the Invention

The present invention generally relates to a LED display, and more particularly to a microLED display.

2. Description of Related Art

A micro-light-emitting diode (microLED, mLED or µLED) display panel is one of flat display panels, and is composed of microscopic microLEDs each having a size of 1-100 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

Conventional microLED displays are either top-emission microLED displays that emit light upward or bottom-emission microLED displays that emit light downward. Conventional microLED display suffer low aperture ratio (that is, the ratio of light transmissive area to total pixel area), thereby reducing display quality. The aperture ratio may be enhanced by reducing the width of electric wires, which is, however, limited by photolithography and etching techniques.

A need has thus arisen to propose a novel scheme to overcome drawbacks and enhance aperture ratio of the microLED displays.

SUMMARY OF THE INVENTION

In view of the foregoing, it is an object of the embodiment of the present invention to provide a dual-sided microLED display with enhanced aperture ratio and reduced optical crosstalk.

According to one embodiment, a light-emitting diode (LED) display includes a top-emission LED, a bottom-emission LED and a spacer. The top-emission LED emits light upward, and the bottom-emission LED emits light downward. The spacer is disposed between the top-emission LED and the bottom-emission LED, thereby providing a dual-sided display.

According to another embodiment, a light-emitting diode (LED) display includes a plurality of pixels, a plurality of transparent electric wires and black matrix (BM). Each pixel includes a plurality of LEDs with first electrodes connected to a driver via data lines respectively and with second electrodes connected together to a common line. The transparent electric wires are disposed in the plurality of pixels. The black matrix (BM) covers the plurality of LEDs and data lines but not covers the transparent electric wires.

DETAILED DESCRIPTION OF THE INVENTION

Figure 1A:
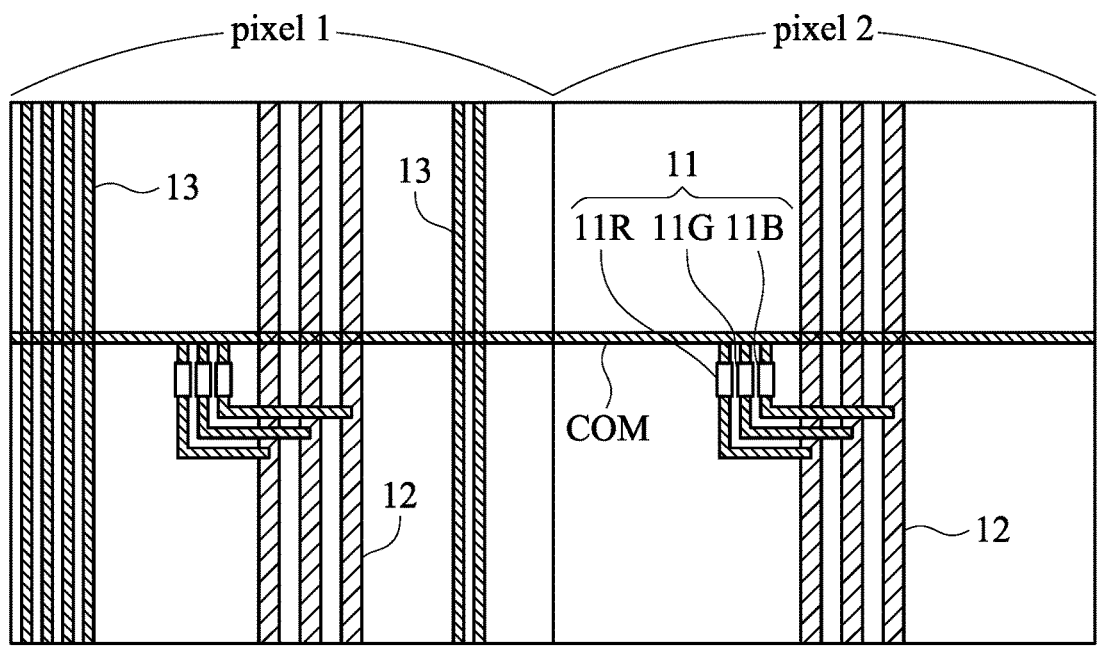
FIG. 1A schematically shows a top view of a portion of a micro-light-emitting diode (microLED) display according to one embodiment of the present invention.

FIG. 1A schematically shows a top view of a portion (e.g., two pixels) of a micro-light-emitting diode (microLED) display 100 according to one embodiment of the present invention. Although microLED displays are exemplified in the following embodiments, it is appreciated that the invention may be generally adapted to light-emitting diode (LED) displays as well.

Specifically, each pixel of the microLED display 100 may include a plurality of microLEDs 11, such as a red microLED 11R, a green microLED 11G and a blue microLED 11B, with first electrodes connected to a driver (not shown) via data lines 12 respectively and with second electrodes connected together to a common (COM) line (or earth). It is appreciated that the microLEDs 11 may be either driven by active matrix addressing or driven by passive matrix addressing.

In the embodiment, the pixels of the microLED display 100 may include a plurality of electric wires 13. According to one aspect of the embodiment, the electric wires 13 of the microLED display 100 are transparent with optical transmittance equal to or greater than 85% and with electrical impedance equal to or less than 30 ohms. In the embodiment, the electric wires 13 may be composed of transparent conductive material, such as indium tin oxide (ITO), indium-doped zinc oxide (IZO) or aluminum-doped zinc oxide (AZO).

Figure 1B:
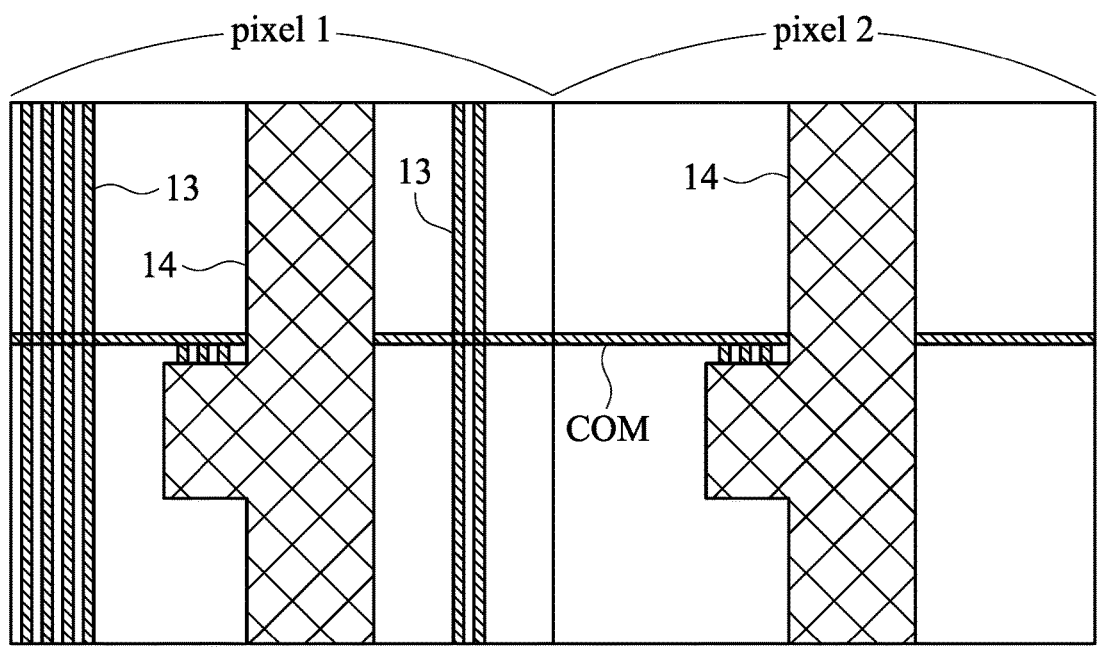
FIG. 1B schematically shows a top view of a portion of the microLED display of FIG. 1A covered with black matrix (BM)

FIG. 1B schematically shows a top view of a portion of the microLED display 100 of FIG. 1A covered with black matrix (BM) 14. As shown in FIG. 1B, the microLEDs 11 and the data lines 12 are commonly covered with the black matrix 14. It is particularly noted that, as the electric wires 13 of the embodiment are transparent, the electric wires 13 need not be covered with the black matrix 14. Therefore, an aperture ratio of the pixel of the microLED display 100 (that is, the ratio of light transmissive area to total pixel area) can be substantially increased.

Figure 2A:
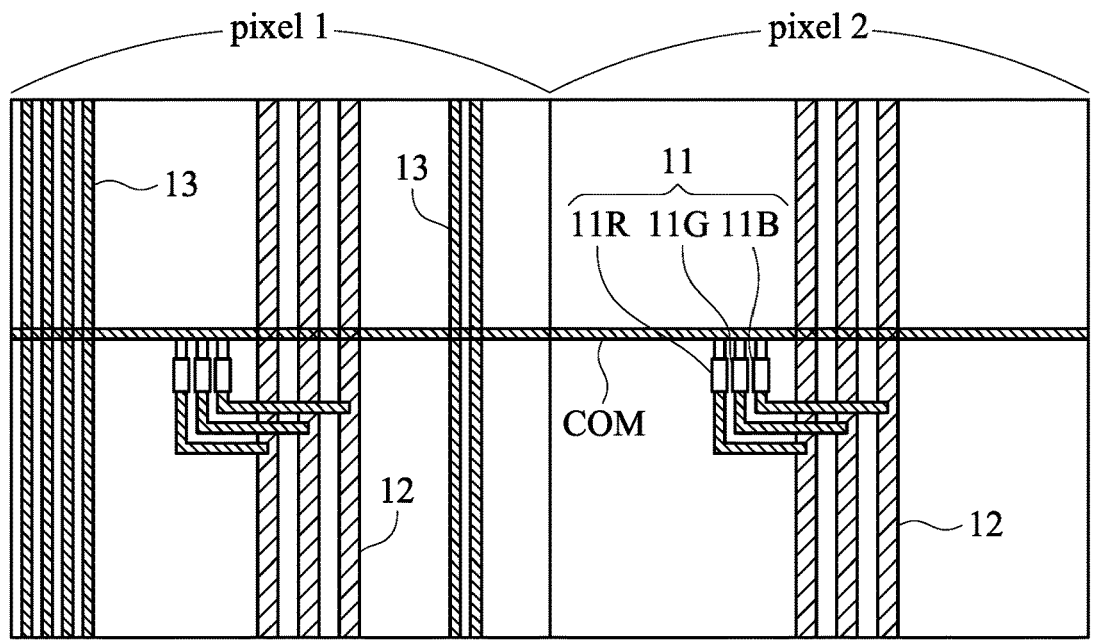
FIG. 2A and FIG. 2B schematically show top views of a portion of a microLED display covered with the black matrix but not adopting the transparent electric wires as in FIG. 1A.
Figure 2B:
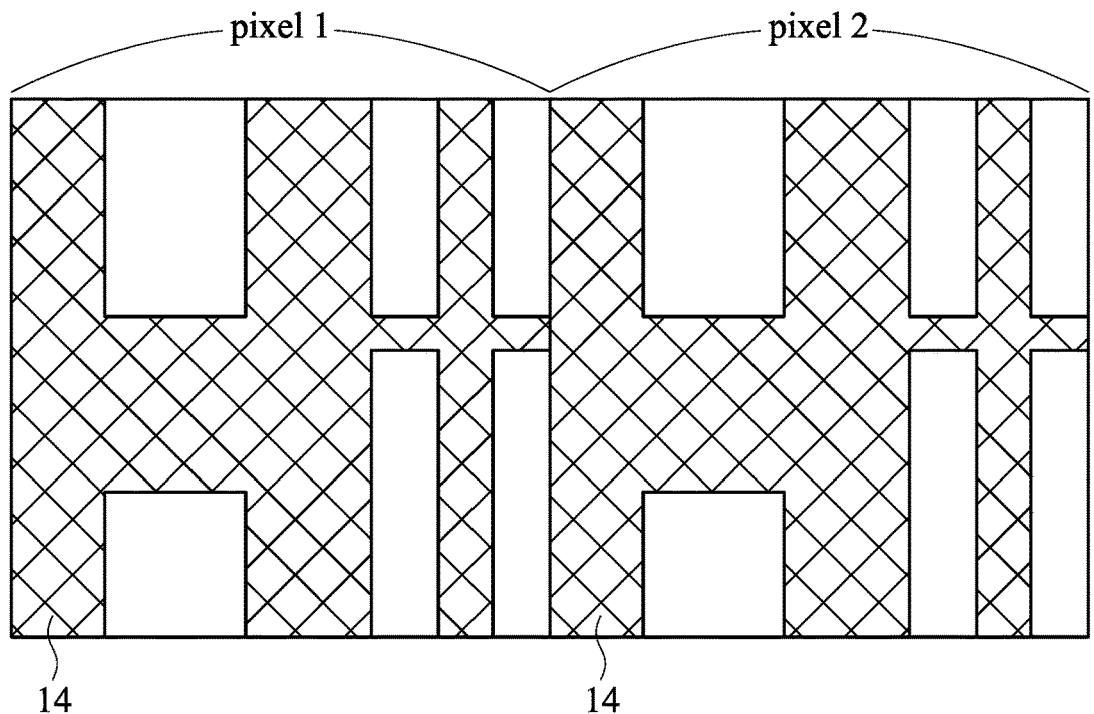

FIG. 2A and FIG. 2B schematically show top views of a portion of a microLED display 200 covered with the black matrix 14 but not adopting the transparent electric wires 13 as in FIG. 1A. As the electric wires 13 of the microLED display 200 of FIG. 2A are not transparent, the black matrix 14 should commonly cover the (opaque) electric wires 13, and the aperture ratio of the microLED display 200 (of FIG. 2A/2B) is thus considerably less than the aperture ratio of the microLED display 100 (of FIG. 1A/1B).

Figure 3:
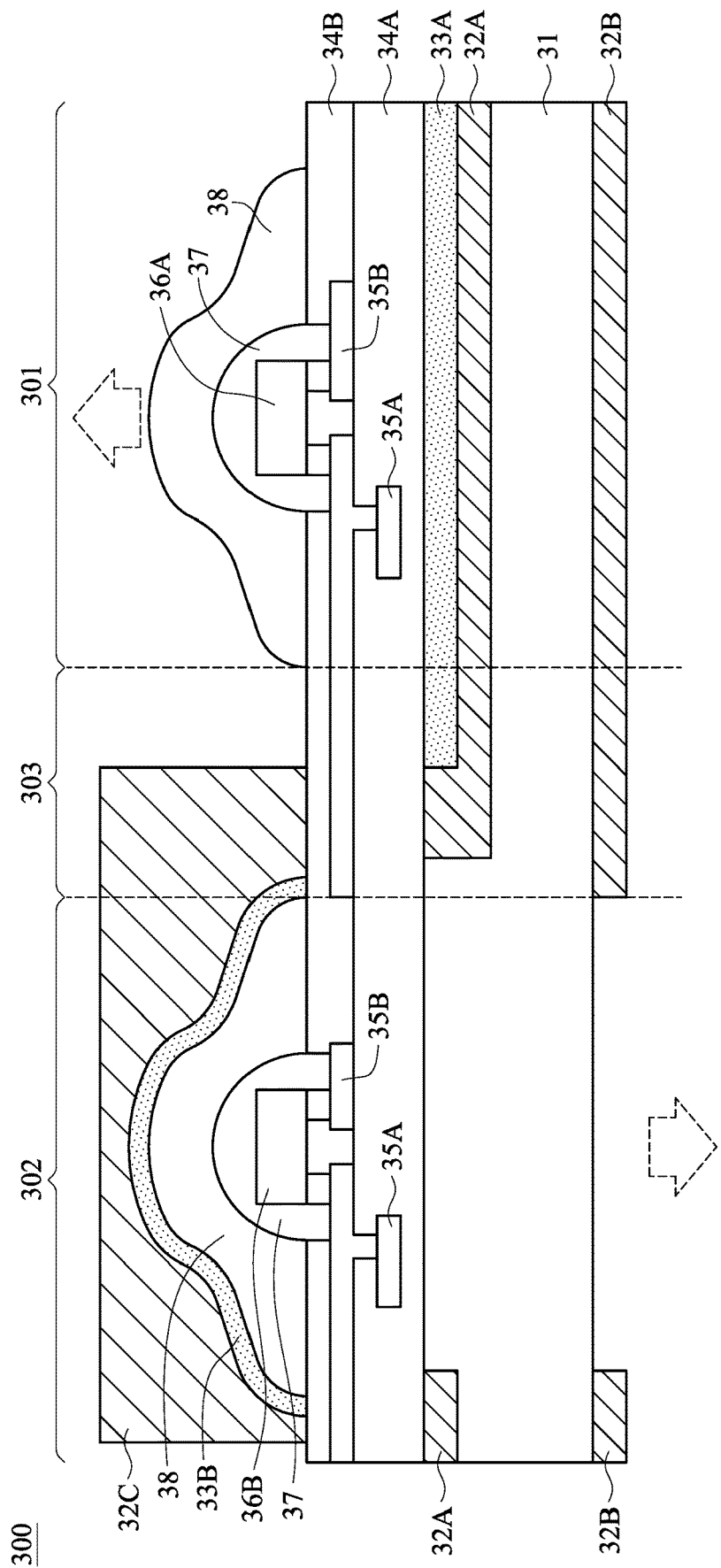
FIG. 3 shows a cross-sectional view of a microLED display according to one embodiment of the present invention.

FIG. 3 shows a cross-sectional view of a microLED display 300 according to one embodiment of the present invention. Although microLED displays are exemplified in the following embodiments, it is appreciated that the invention may be generally adapted to light-emitting diode (LED) displays as well. In the embodiment, the microLED display 300 may a include top-emission microLED 301 that emits light upward, a bottom-emission microLED 302 that emits light downward, and a spacer 303 disposed between the top-emission microLED 301 and the bottom-emission microLED 302, thereby providing a dual-sided display.

Specifically, the top-emission microLED 301 may include a transparent substrate 31, which provides a support for the top-emission microLED 301, the bottom-emission microLED 302 and the spacer 303. The top-emission microLED 301 may include a first light blocking layer 32A entirely formed above (e.g., on a top surface of) the transparent substrate 31 (and extended to the spacer 303), and a second light blocking layer 32B entirely formed below (e.g., on a bottom surface of) the transparent substrate 31 (and extended to the spacer 303). It is noted that the extended first light blocking layer 32A (in the spacer 303) may be different in length from (e.g., less than) the extended second light blocking layer 32B (in the spacer 303). In one embodiment, the first light blocking layer 32A and the second light blocking layer 32B are composed of a dark, no-reflective, non-transmissive and light-absorption material with optical density equal to or greater than 3.

The top-emission microLED display 301 may include a first reflective layer 33A entirely formed above (e.g., on a top surface of) the first light blocking layer 32A (and extended to the spacer 303). In one embodiment, reflectivity of the first reflective layer 33A is equal to or greater than 70%. The top-emission microLED display 301 may include a first insulation layer 34A and a second insulation layer 34B consecutively formed above the first reflective layer 33A (or above the transparent substrate 31), and may include a first metal conductive layer 35A and a second metal conductive layer 35B respectively formed in the first insulation layer 34A and the second insulation layer 34B. The top-emission microLED 301 may include a first microLED 36A disposed above (e.g., on a top surface of) the second insulation layer 34B (or above the first reflective layer 33A), an encapsulation layer 37 covering the first microLED 36A, and a light guide layer 38 formed above (e.g., on a top surface of) the encapsulation layer 37. In one embodiment, refractivity of the encapsulation layer 37 is greater than 1.

The bottom-emission microLED 302 may include the transparent substrate 31, the first light blocking layer 32A formed above a top peripheral surface of the transparent substrate 31, and the second light blocking layer 32B formed below a bottom peripheral surface of the transparent substrate 31. The bottom-emission microLED display 302 may include the first insulation layer 34A and the second insulation layer 34B consecutively formed above the transparent substrate 31, and may include the first metal conductive layer 35A and the second metal conductive layer 35B respectively formed in the first insulation layer 34A and the second insulation layer 34B. The bottom-emission microLED 302 may include a second microLED 36B disposed above (e.g., on a top surface of) the second insulation layer 34B, the encapsulation layer 37 covering the second microLED 36B, and the light guide layer 38 formed above (e.g., on the top surface of) the encapsulation layer 37.

The bottom-emission microLED 302 may include a second reflective layer 33B formed above (e.g., on a top surface of) the light guide layer 38 (or above the second microLED 36B), and a third light blocking layer 32C formed above (e.g., on a top surface of) the second reflective layer 33B (and extended to the spacer 303). In one embodiment, reflectivity of the second reflective layer 33B is equal to or greater than 70%. In one embodiment, the third light blocking layer 32C is composed of a dark, no-reflective, non-transmissive and light-absorption material with optical density equal to or greater than 3.

Figure 4A:
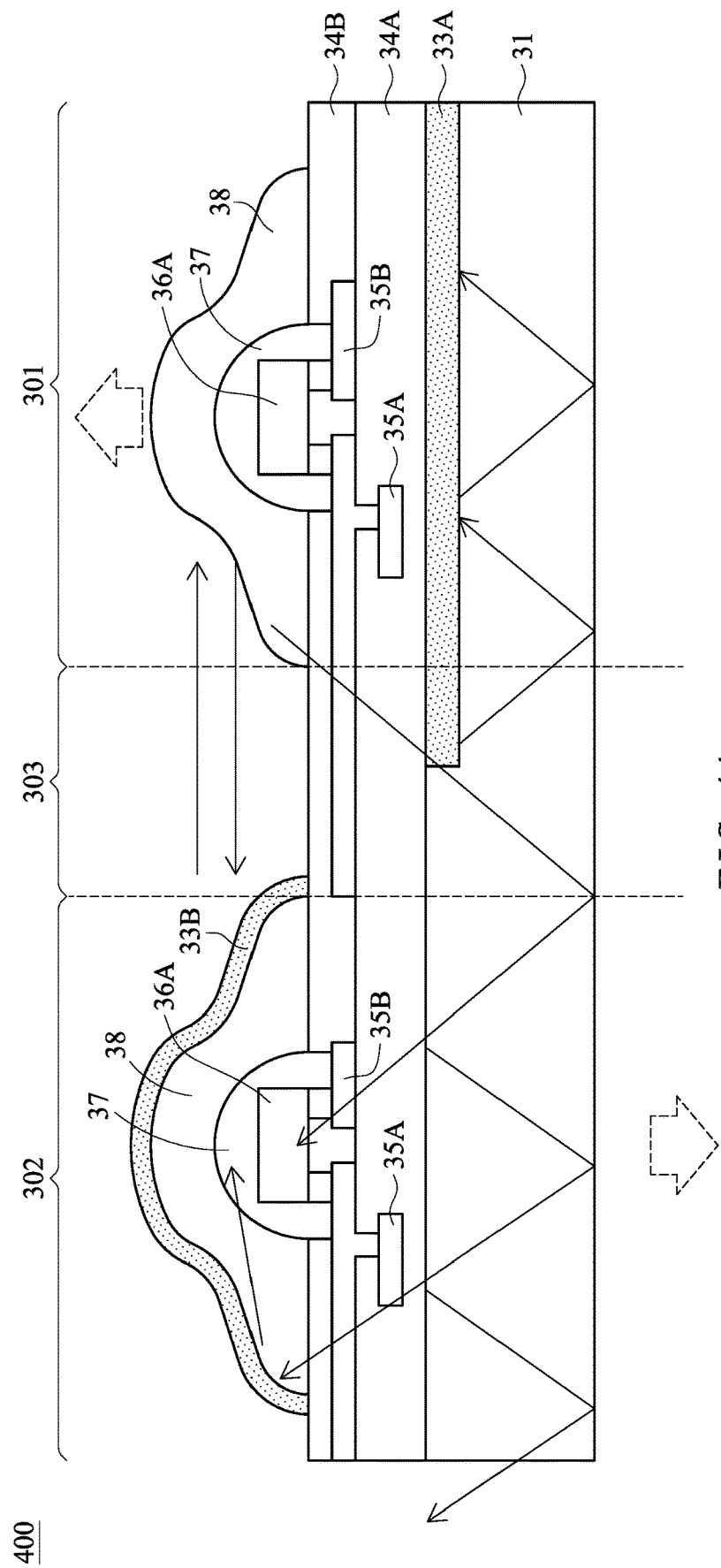
FIG. 4A illustrates optical crosstalk caused by a top-emission microLED of a microLED display without adopting the first light blocking layer, the second light blocking layer and the third light blocking layer of FIG. 3.
Figure 4B:
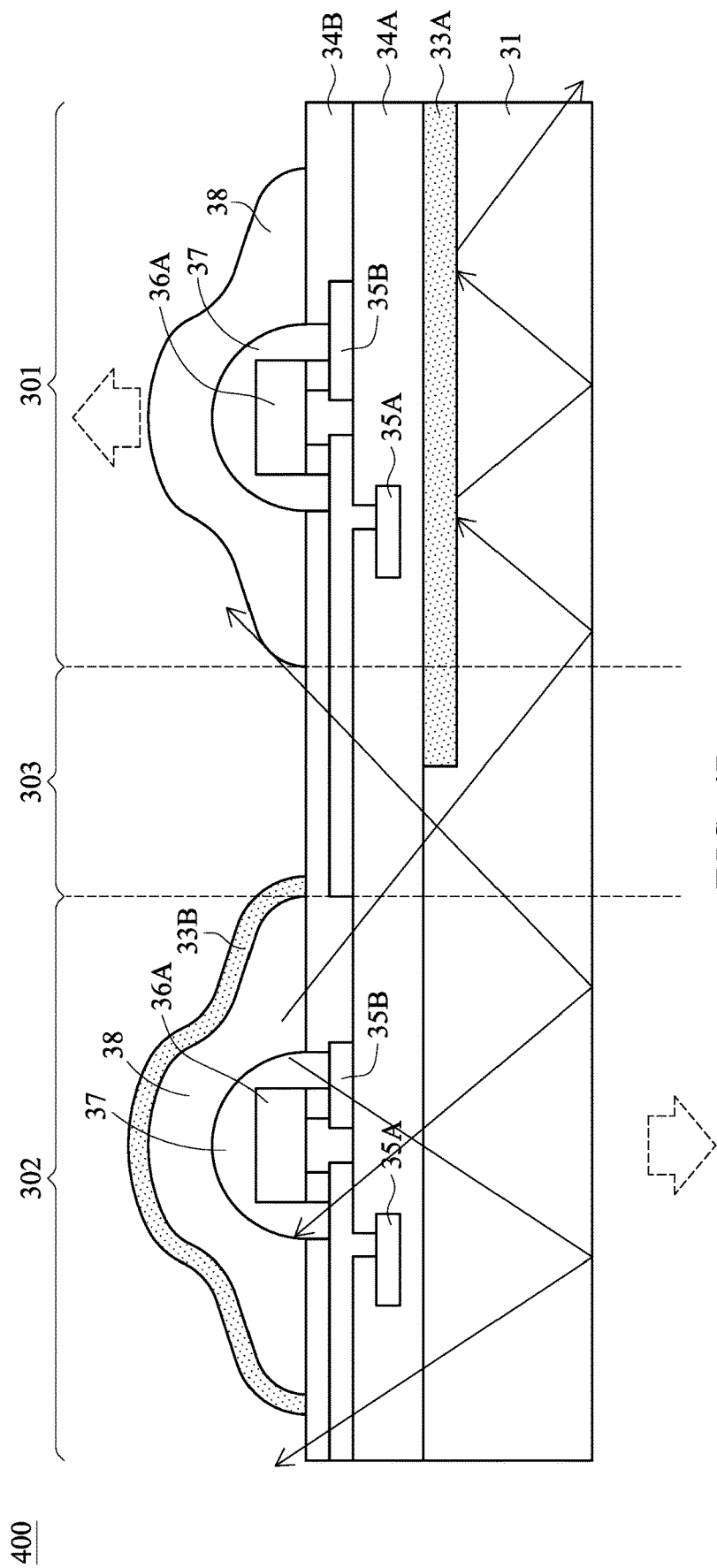
FIG. 4B illustrates optical crosstalk caused by a bottom-emission microLED of the microLED display without adopting the first light blocking layer, the second light blocking layer and the third light blocking layer of FIG. 3.
Figure 4C:
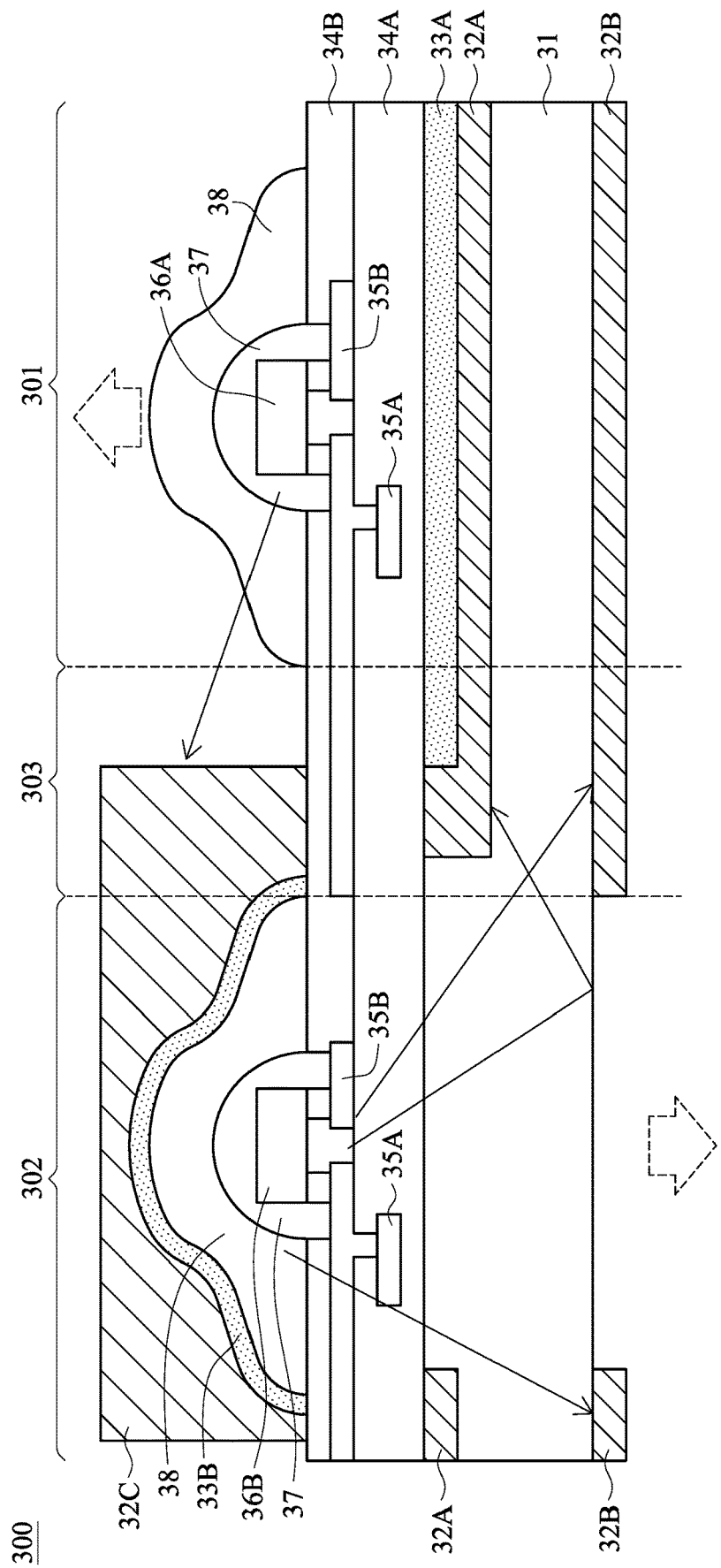
FIG. 4C shows blocking of unexpected light caused by the top-emission microLED and the bottom-emission microLED of the microLED display (of FIG. 3) capable of preventing optical crosstalk.

FIG. 4A illustrates optical crosstalk caused by a top-emission microLED 301 of a microLED display 400 without adopting the first light blocking layer 32A, the second light blocking layer 32B and the third light blocking layer 32C of FIG. 3. FIG. 4B illustrates optical crosstalk caused by a bottom-emission microLED 302 of the microLED display 400 without adopting the first light blocking layer 32A, the second light blocking layer 32B and the third light blocking layer 32C of FIG. 3. FIG. 4C shows blocking of unexpected light caused by the top-emission microLED 301 and the bottom-emission microLED 302 of the microLED display 300 (of FIG. 3) capable of preventing optical crosstalk.

Figure 5A:
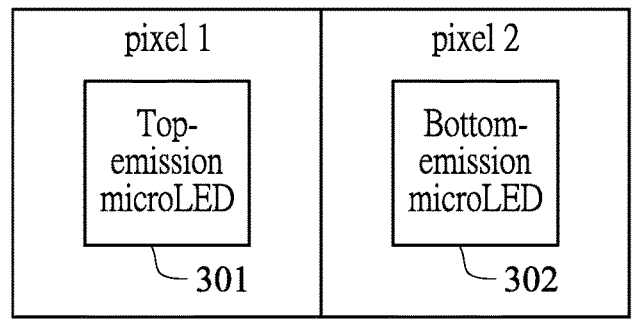
FIG. 5A schematically shows a top view of a portion of the microLED display of FIG. 3 according to one embodiment of the present invention.

FIG. 5A schematically shows a top view of a portion (e.g., two pixels) of the microLED display 300 of FIG. 3 according to one embodiment of the present invention. In the embodiment, the top-emission microLED 301 and the bottom-emission microLED 302 belong to different pixels, respectively. The top-emission microLED 301 and the bottom-emission microLED 302 may be driven by independent signals alternately, or may be driven by independent signals concurrently.

Figure 5B:
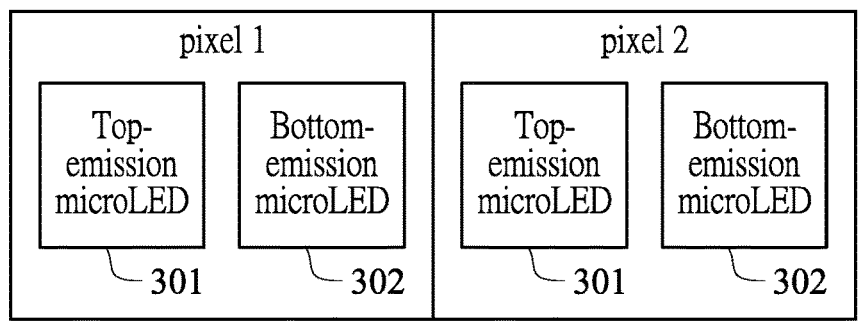
FIG. 5B schematically shows a top view of a portion of the microLED display of FIG. 3 according to another embodiment of the present invention.

FIG. 5B schematically shows a top view of a portion (e.g., two pixels) of the microLED display 300 of FIG. 3 according to another embodiment of the present invention. In the embodiment, the top-emission microLED 301 and the bottom-emission microLED 302 belong to the same pixel. The top-emission microLED 301 and the bottom-emission microLED 302 of the same pixel may be driven by independent signals alternately, or may be driven by independent signals concurrently.

Figures 6A, 6B, 6C:
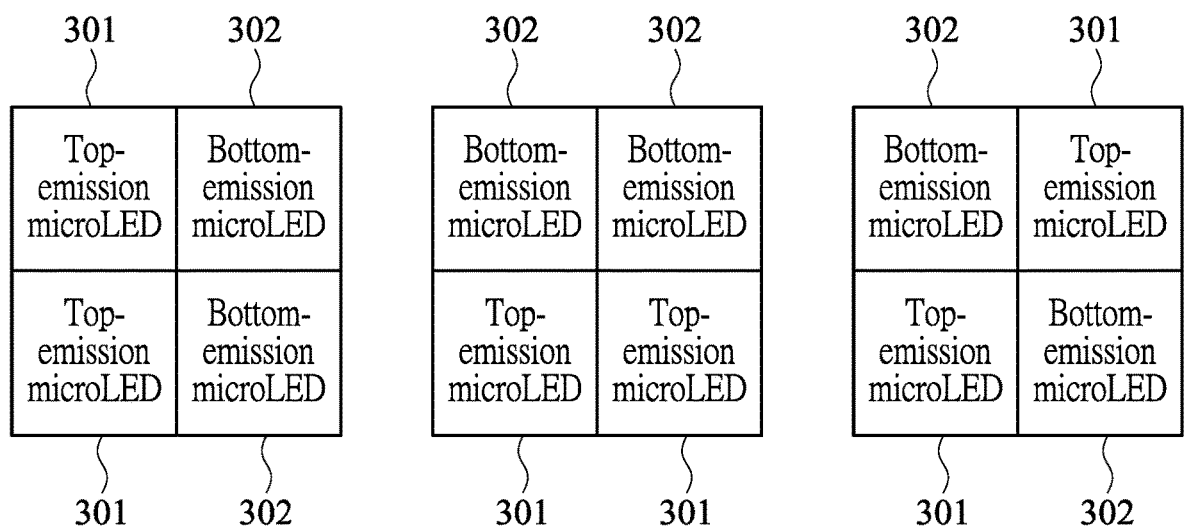
FIG. 6A schematically shows a top view illustrating arrangement of the top-emission microLEDs and the bottom-emission microLEDs according to one embodiment of the present invention.
FIG. 6B schematically shows a top view illustrating arrangement of the top-emission microLEDs and the bottom-emission microLEDs according to another embodiment of the present invention.
FIG. 6C schematically shows a top view illustrating arrangement of the top-emission microLEDs and the bottom-emission microLEDs according to a further embodiment of the present invention.

FIG. 6A schematically shows a top view illustrating arrangement of the top-emission microLEDs 301 and the bottom-emission microLEDs 302 according to one embodiment of the present invention. In the embodiment, the top-emission microLEDs 301 are longitudinally disposed, and the bottom-emission microLEDs 302 are longitudinally disposed.

FIG. 6B schematically shows a top view illustrating arrangement of the top-emission microLEDs 301 and the bottom-emission microLEDs 302 according to another embodiment of the present invention. In the embodiment, the top-emission microLEDs 301 are laterally disposed, and the bottom-emission microLEDs 302 are laterally disposed.

FIG. 6C schematically shows a top view illustrating arrangement of the top-emission microLEDs 301 and the bottom-emission microLEDs 302 according to a further embodiment of the present invention. In the embodiment, the top-emission microLEDs 301 are interlaced with the bottom-emission microLEDs 302.

Although specific embodiments have been illustrated and described, it will be appreciated by those skilled in the art that various modifications may be made without departing from the scope of the present invention, which is intended to be limited solely by the appended claims.

What is claimed is:

1. A light-emitting diode (LED) display, comprising:
a top-emission LED that emits light upward;
a bottom-emission LED that emits light downward; and
a spacer disposed between the top-emission LED and the bottom-emission LED, thereby providing a dual-sided display;
wherein the top-emission LED comprises:
a transparent substrate;
a first light blocking layer entirely formed above the transparent substrate and extended to the spacer; and
a second light blocking layer entirely formed below the transparent substrate and extended to the spacer.

2. The display of claim 1, wherein the top-emission LED comprises:
a first reflective layer entirely formed above the first light blocking layer and extended to the spacer; and
a first LED disposed above the first reflective layer.

3. The display of claim 1, wherein the first light blocking layer extended to the spacer is different in length from the second light blocking layer extended to the spacer.

4. The display of claim 2, wherein the top-emission LED further comprises:
a first insulation layer and a second insulation layer consecutively formed above the first reflective layer;
a first metal conductive layer and a second metal conductive layer respectively formed in the first insulation layer and the second insulation layer;
an encapsulation layer covering the first LED; and
a light guide layer formed above the encapsulation layer.

5. The display of claim 4, wherein the encapsulation layer has refractivity being greater than 1.

6. The display of claim 4, wherein the bottom-emission LED comprises:
the first light blocking layer formed above a top peripheral surface of the transparent substrate;
the second light blocking layer formed below a bottom peripheral surface of the transparent substrate;
a second LED disposed above the transparent substrate;
a second reflective layer formed above the second LED; and
a third light blocking layer formed above the second reflective layer and extended to the spacer.

7. The display of claim 6, wherein the first reflective layer and the second reflective layer have reflectivity being equal to or greater than 70%.

8. The display of claim 6, wherein the first light blocking layer, the second light blocking layer and the third light blocking layer comprise a dark, no-reflective, non-transmissive and light-absorption material with optical density equal to or greater than 3.

9. The display of claim 6, wherein the bottom-emission LED further comprises:
the first insulation layer and the second insulation layer consecutively formed above the transparent substrate;
the first metal conductive layer and the second metal conductive layer respectively formed in the first insulation layer and the second insulation layer;
the encapsulation layer covering the second LED; and
the light guide layer formed above the encapsulation layer.

10. The display of claim 1, wherein the top-emission LED and the bottom-emission LED are driven by independent signals, and belong to different pixels respectively.

11. The display of claim 1, wherein the top-emission LED and the bottom-emission LED are driven by independent signals, and belong to a same pixel.

12. The display of claim 1, wherein top-emission LEDs are longitudinally disposed, and bottom-emission LEDS are longitudinally disposed.

13. The display of claim 1, wherein top-emission LEDs are laterally disposed, and bottom-emission LEDs are laterally disposed.

14. The display of claim 1, wherein top-emission LEDs are interlaced with bottom-emission LEDs.

15. The display of claim 1, wherein the top-emission LED and the bottom-emission LED are micro-light-emitting diodes (microLEDs).

16. A light-emitting diode (LED) display, comprising:
a plurality of pixels, each including a plurality of LEDs with first electrodes connected to a driver via data lines respectively and with second electrodes connected together to a common line;
a plurality of transparent electric wires disposed in the plurality of pixels; and
black matrix (BM) covering the plurality of LEDs and data lines but not covering the transparent electric wires.

17. The display of claim 16, wherein the transparent electric wires have optical transmittance equal to or greater than 85%.

18. The display of claim 16, wherein the transparent electric wires comprise transparent conductive material.

19. The display of claim 18, wherein the transparent conductive material comprises indium tin oxide (ITO), indium-doped zinc oxide (IZO) or aluminum-doped zinc oxide (AZO).

20. The display of claim 16, wherein the plurality of LEDs are micro-light-emitting diodes (microLEDs).

* * * * *